(12) United States Patent
Zhu et al.

(10) Patent No.: US 11,296,123 B2
(45) Date of Patent: Apr. 5, 2022

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Ning Zhu, Beijing (CN); Qiujie Su, Beijing (CN); Chongyang Zhao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 956 days.

(21) Appl. No.: 15/779,222

(22) PCT Filed: Sep. 29, 2017

(86) PCT No.: PCT/CN2017/104162
§ 371 (c)(1),
(2) Date: May 25, 2018

(87) PCT Pub. No.: WO2018/166178
PCT Pub. Date: Sep. 20, 2018

(65) Prior Publication Data
US 2021/0193685 A1    Jun. 24, 2021

(30) Foreign Application Priority Data

Mar. 17, 2017 (CN) .......................... 201710159841.0

(51) Int. Cl.
*H01L 27/12*    (2006.01)

(52) U.S. Cl.
CPC .......... *H01L 27/124* (2013.01); *H01L 27/127* (2013.01)

(58) Field of Classification Search
None
See application file for complete search history.

(56) References Cited

U.S. PATENT DOCUMENTS

2012/0069286 A1    3/2012    Huang et al.
2014/0167031 A1    6/2014    Choi et al.
(Continued)

FOREIGN PATENT DOCUMENTS

CN    103926759 A    7/2014
CN    104880871 A    9/2015
(Continued)

OTHER PUBLICATIONS

First Office Action for Korean Application No. 10-2019-7025115, dated Jul. 31, 2020, 5 Pages.
(Continued)

*Primary Examiner* — Evren Seven
(74) *Attorney, Agent, or Firm* — Brooks Kushman P.C.

(57) ABSTRACT

An array substrate and a manufacturing method thereof, a display panel and a display device are provided. The array substrate includes common electrodes, multiple first common electrode lines and multiple second common electrode lines. The multiple first common electrode lines intersect with the multiple second common electrode lines to form grids. The multiple first common electrode lines are connected with the common electrodes through first via-holes and the multiple second common electrode lines are connected with the common electrodes through second via-holes.

15 Claims, 1 Drawing Sheet

(56) References Cited

U.S. PATENT DOCUMENTS

| | | | |
|---|---|---|---|
| 2015/0035167 A1 | 2/2015 | Wang et al. | |
| 2015/0185513 A1* | 7/2015 | Wu | G02F 1/1368 257/72 |
| 2017/0277008 A1 | 9/2017 | Jiang et al. | |

FOREIGN PATENT DOCUMENTS

| | | |
|---|---|---|
| CN | 105093750 A | 11/2015 |
| CN | 103077944 B | 3/2016 |
| CN | 106876413 A | 6/2017 |
| JP | 2015529012 A | 10/2015 |
| KR | 20080013163 A | 2/2008 |
| KR | 20140065865 A | 5/2014 |
| KR | 101522481 B1 | 5/2015 |

OTHER PUBLICATIONS

Extended European Search Report for Application No. EP 17900750.5, dated Oct. 23, 2020, 13 Pages.
International Search Report and Written Opinion for Application No. PCT/CN2017/104162, dated Jan. 9, 2018, 12 Pages.
First Office Action for Korean Application No. 10-2021-7016003, dated Aug. 2, 2021, 5 Pages.
First Office Action for Japanese Application No. 2019-548476, dated Sep. 7, 2021, Pages.

\* cited by examiner

# ARRAY SUBSTRATE AND MANUFACTURING METHOD THEREOF, DISPLAY PANEL AND DISPLAY DEVICE

CROSS-REFERENCE TO RELATED APPLICATION APPLICATIONS

This application is the U.S. national phase of PCT Application No. PCT/CN2017/104162 filed on Sep. 29, 2017, which claims priority to Chinese Patent Application No. 201710159841.0 filed on Mar. 17, 2017, which are incorporated herein by reference in their entireties.

TECHNICAL FIELD

The present disclosure relates to the field of displaying technology, and more particularly, to an array substrate and a manufacturing method thereof, a display panel and a display device.

BACKGROUND

For an array substrate including a common electrode in related technology, a metallic common electrode line, also referred as a gate layer common electrode line, may be provided in a gate metal layer and arranged in parallel with a gate line in order to reduce a resistance of a transparent common electrode and transmit a signal for the common electrode. The gate layer common electrode line is connected with the transparent common electrode through a via-hole.

SUMMARY

The present disclosure provides an array substrate and a manufacturing method thereof, a display panel and a display device, to reduce resistances of transparent common electrodes and to transmit signals for the common electrodes. Metallic common electrode lines (also referred as gate layer common electrode lines) may be provided in a gate metal layer and in parallel with gate lines. The gate layer common electrode lines are connected with the transparent common electrodes through via-holes.

In view of the above, the present disclosure provides an array substrate, including transparent common electrodes, multiple first common electrode lines and multiple second common electrode lines. The multiple first common electrode lines intersect with the multiple second common electrode lines to form grids. The multiple first common electrode lines are connected with the common electrodes through first via-holes and the multiple second common electrode lines are connected with the common electrodes through second via-holes.

Optionally, the multiple first common electrode lines are arranged in a different layer from the multiple second common electrode lines.

Optionally, the array substrate further includes multiple gate lines. The first common electrode lines are arranged in an identical layer to and in parallel with the gate lines.

Optionally, the array substrate further includes multiple data lines. The second common electrode lines are arranged in an identical layer to and in parallel with the data lines.

Optionally, the array substrate is a double-gate-line type array substrate. Two gate lines are provided between two adjacent rows of subpixels. One data line is provided every two adjacent columns of subpixels. Each second common electrode line is provided between two columns of subpixels where no data line is provided.

Optionally, the common electrodes for respective subpixels are arranged separately. The common electrodes at an identical row are connected with each other through the first common electrode line, and the common electrodes at an identical column are connected with each other through the second common electrode line.

Optionally, the first via-hole is deeper than the second via-hole.

Optionally, the array substrate further includes a base substrate, a gate insulating layer, a pixel electrode and an insulating layer. The first common electrode lines are arranged on the base substrate. The gate insulating layer is arranged on the base substrate and covers the multiple first common electrode lines. The pixel electrode and the multiple second common electrode lines are arranged on the gate insulating layer. The insulating layer is arranged on the gate insulating layer and covers the pixel electrode and the multiple second common electrode lines. The transparent common electrodes are arranged on the insulating layer. The first via-holes extend through the insulating layer and the gate insulating layer and the second via-holes extend through the insulating layer.

The present disclosure further provides a display panel, including the above array substrate.

The present disclosure further provides a display device, including the above display panel.

The present disclosure further provides a method for manufacturing an array substrate, including: forming grids by intersecting multiple first common electrode lines with multiple second common electrode lines; and forming transparent common electrodes, the multiple first common electrode lines and the multiple second common electrode lines in a way that the multiple first common electrode lines are connected with the transparent common electrodes through first via-holes and the multiple second common electrode lines are connected with the transparent common electrodes through second via-holes.

Optionally, the multiple first common electrode lines are arranged in a different layer from the multiple second common electrode lines.

Optionally, the forming the transparent common electrodes, the multiple first common electrode lines and the multiple second common electrode lines includes: forming the multiple first common electrode lines and multiple gate lines in parallel with the multiple first common electrode lines through one patterning process.

Optionally, the forming the transparent common electrodes, the multiple first common electrode lines and the multiple second common electrode lines includes: forming the multiple second common electrode lines and multiple data lines in parallel with the multiple second common electrode lines through one patterning process.

DETAILED DESCRIPTION

Figure 1:
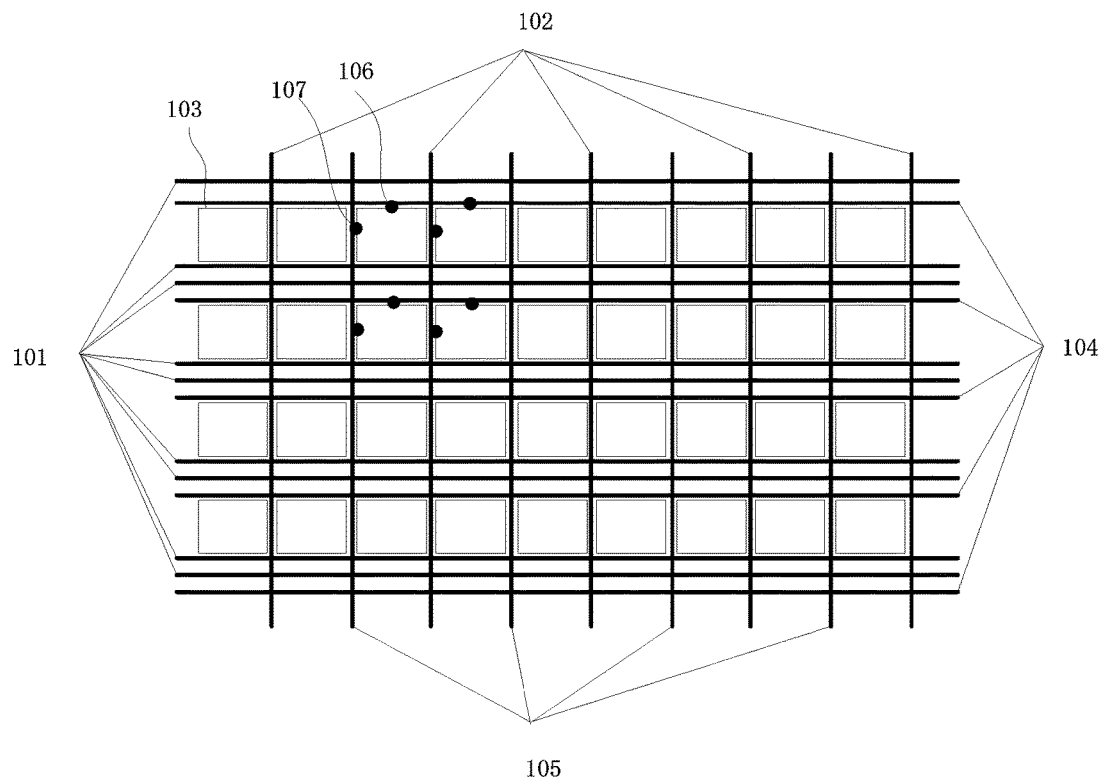
FIG. 1 is a top view of an array substrate according to an embodiment of the present disclosure.

To further clarify objects, technical solutions and advantages of embodiments of the present disclosure, the technical solutions in the embodiments of the present disclosure are to be described in a clear and complete way in conjunction with drawings for the embodiments of the present disclosure. Apparently, described embodiments are a part of rather than all of the embodiments of the present disclosure. Any other embodiments obtained by the ordinary skilled in the art based on the described embodiments of the present disclosure shall fall within scope of protection of the present disclosure.

For an array substrate in related technology, a gate layer common electrode line is merely provided in a horizontal direction, hence, a common voltage for a whole panel is of relatively un-uniform distribution and the common voltage is not stable, resulting in poor displaying performance. An array substrate is provided according to an embodiment of the present disclosure, including: a transparent common electrode, multiple first common electrode lines and multiple second common electrode lines. The multiple first common electrode lines intersect with the multiple second common electrode lines to form grids. Each first common electrode line is connected with the common electrode through a first via-hole and each second common electrode line is connected with the common electrode through a second via-hole.

According to the embodiment of the present disclosure, a resistance of the common electrode can be effectively reduced by providing, for the common electrode of the array substrate, the common electrode lines forming the grids and connected with the common electrode. In addition, by distributing the common electrode lines in grids instead of arranging the gate layer common electrode line only in the horizontal direction, the whole panel can be ensured with a stable and uniform common voltage. Furthermore, since the resistance of the common electrode can be effectively reduced with the common electrode lines in grids, a line width of each common electrode line can be accordingly reduced, thereby improving aperture ratio.

Usually, the common electrode is made of a transparent conductive material such as ITO.

Optionally, the first common electrode lines and the second common electrode lines may be made of a metallic conductive material, to facilitate reduction of the resistance of the common electrode.

However according to some other embodiments of the present disclosure, it is not excluded that the first common electrode lines and the second common electrode lines are made of a transparent conductive material to improve aperture ratio.

Optionally, a grid structure formed by the first common electrode lines and the second common electrode lines covers an area where the common electrode is located.

According to embodiments of the present disclosure, the first common electrode lines may be arranged at an identical layer to the second common electrode lines, or may be arranged at a different layer from the second common electrode lines.

In a case that the first common electrode lines are arranged at an identical layer to the second common electrode lines, the first common electrode lines are connected to the second common electrode lines. In this case, the first common electrode lines and the second common electrode lines usually needs to be arranged at an independent layer to avoid interfering with patterns on other functional film layers of the array substrate.

In a case that the first common electrode lines are arranged at a different layer from the second common electrode lines, at least one of the first common electrode lines and the second common electrode lines may be arranged at an identical layer to other functional film layer of the array substrate, to reduce a thickness of the film layers. Optionally, at least one of the first common electrode lines and the second common electrode lines may be arranged at an identical layer to other conductive functional film layer and can be formed together with the conductive functional film layer through one patterning process, which decreases a quantity of mask(s) and reduces the cost.

The array substrate further includes multiple gate lines. Optionally, the first common electrode lines and the gate lines may be arranged at an identical layer to decrease a quantity of mask and reduce the cost. Furthermore, optionally, the first common electrode lines may be arranged in parallel with the gate lines. Obviously according to some other embodiments of the present disclosure, it is not excluded that the first common electrode lines are arranged at an identical layer to the gate lines and perpendicular to the gate lines; in this case, each first common electrode line needs to be disconnected at intersections with the gate lines.

In the case that the first common electrode lines are arranged at an identical layer to the gate lines and in parallel with the gate lines, one row of subpixels may correspond to one first common electrode line or multiple rows of subpixels may correspond to one first common electrode line.

The array substrate further includes multiple data lines. Optionally, the second common electrode lines and the data lines may be arranged at an identical layer to decrease a quantity of mask and reduce the cost. Furthermore, optionally, the second common electrode lines may be arranged in parallel with the data lines. Obviously according to some other embodiments of the present disclosure, it is not excluded that the second common electrode lines are arranged at an identical layer to the data lines and perpendicular to the data lines; in this case, each second common electrode line needs to be disconnected at intersections with the data lines.

In the case that the second common electrode lines are arranged at an identical layer to the data lines and in parallel with the data lines, one column of subpixels may correspond to one second common electrode line or multiple columns of subpixels may correspond to one second common electrode line.

Referring to the drawings, FIG. 1 is a top view of an array substrate according to an embodiment of the present disclosure. The array substrate according to the embodiment of the present disclosure is a double-gate-line type array substrate. The array substrate includes multiple gate lines 101 and multiple data lines 102. Two gate lines 101 are provided between two adjacent rows of subpixels. One data line 102 is provided every two adjacent columns of subpixels and two columns of subpixels are located between every two data lines. Common electrodes 103 for respective subpixels are arranged separately. The array substrate further includes multiple first common electrode lines 104 and multiple second common electrode lines 105. The first common electrode lines 104 are arranged at an identical layer to and in parallel with the gate lines 101. The second common electrode lines 105 are arranged at an identical layer to and in parallel with the data lines. Each of the second common electrode lines 105 is provided between two columns of subpixels where no data line 102 is provided. The first common electrode lines 104 and the second common electrode lines 105 form grids. The first common electrode lines 104 are connected to the common electrodes 103 through first via-holes 106. The second common electrode lines 105 are connected to the common electrodes 103 through second via-holes 107.

According to the embodiment of the present disclosure, the double-gate-line type array substrate has a specific structure that two columns of subpixels are located between every two data lines, such that the second common electrode lines are provided between columns of subpixels where no date line is provided and form grids together with the first common electrode lines, thereby ensuring a stable and uniform common voltage for a whole panel. In addition, since resistances of the common electrodes can be effectively decreased due to the common electrode lines in grids, a line width of each common electrode line can be reduced accordingly to improve aperture ratio.

According to the embodiment of the present disclosure, the common electrodes 103 for respective subpixels are arranged separately, an identical row of common electrodes 103 is connected with each other through the first common electrode line 104 and an identical column of common electrodes 103 is connected with each other through the second common electrode line 105. Hence, all common electrodes 103 of a whole face are connected with each other.

In related technology, in the case that common electrodes for respective subpixels of the array substrate are arranged separately, connection between common electrodes for adjacent subpixels should be achieved by bridge wires through via-holes and an upper metal layer (such as a source and drain metal layer or a common electrode layer), thereby achieving connection among all common electrodes of the whole face. With this design, not only additional wires are necessary but also capacitances between the additional wires and other electrodes (such as source or drain electrodes, gate electrodes) overlapping the additional wires or located at lateral sides of the additional wires are introduced. The introduced capacitances may result in increasing load and may further affect subpixel charging.

According to the embodiment of the present disclosure, there is no need to provide the bridge wires. In a horizontal direction, an identical row of common electrodes can be connected through the first common electrode line, in a vertical direction, an identical column of common electrodes can be connected through the second common electrode line; hence, the structure is simple. In addition, capacitances between the common electrodes and electrodes located at a periphery of the common electrodes are effectively reduced, which facilitates subpixel charging.

Figure 2:
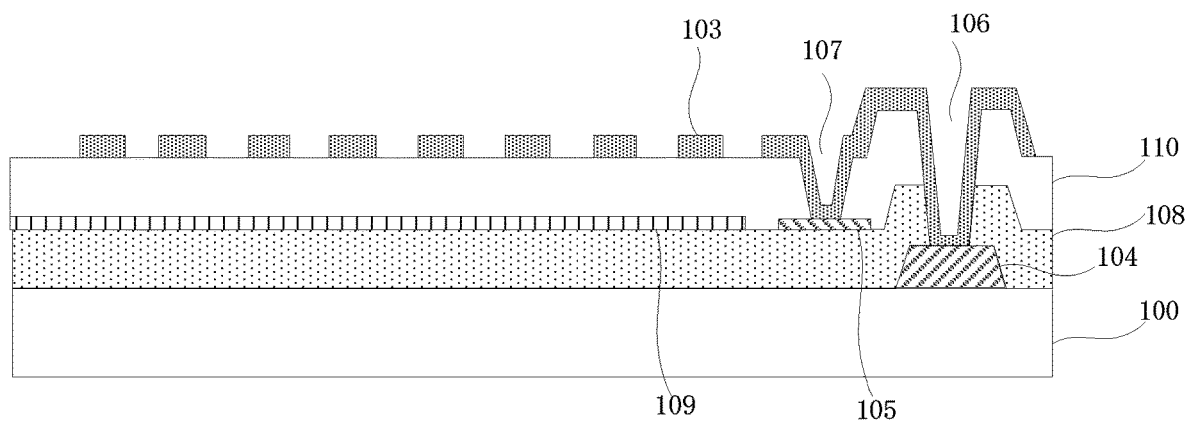
FIG. 2 is a sectional view of an array substrate according to another embodiment of the present disclosure.

Reference can be made to FIG. 2, which is a sectional view of an array substrate according to another embodiment of the present disclosure. The array substrate according to the embodiment differs from that according to the embodiment of FIG. 1 in that, the common electrode 103 here is a strip common electrode while the common electrode 103 according to the embodiment of FIG. 1 is a block common electrode. In FIG. 2, a numeral reference 100 represents a base substrate, a numeral reference 108 represents a gate insulating layer, a numeral reference 109 represents a pixel electrode and a numeral reference 110 represents an insulating layer.

As clearly reflected in FIG. 2, the common electrode 103 can be connected with a first common electrode line 104 in a gate metal layer and a second common electrode line 105 in a source and drain metal layer respectively through a first via-hole 106 and a second via-hole 107. The first via-hole 106 is a deep via-hole and the second via-hole 107 is a shallow via-hole.

The array substrate according to the embodiment of the present disclosure may be an HADS array substrate, an IPS array substrate or other array substrate including common electrodes.

A display panel is further provided according to an embodiment of the present disclosure, including the array substrate according to any foregoing embodiment.

A display device is further provided according to an embodiment of the present disclosure, including the above display panel.

The display device according to the embodiment of the present disclosure may further include a driving chip. The driving chip may be connected to the first common electrode lines and/or the second common electrode lines and used to transmit a common voltage signal to the common electrodes through the first common electrode lines and/or the second electrode lines.

A method for manufacturing an array substrate is provided according to an embodiment of the present disclosure. The method includes a step of forming transparent common electrodes and a step of forming multiple first common electrode lines and multiple second common electrode lines. The multiple first common electrode lines intersect with the multiple second common electrode lines to form grids. The first common electrode lines are connected with the common electrodes through first via-holes and the second common electrode lines are connected with the common electrodes through second via-holes.

Optionally, the first common electrode lines are arranged at a different layer from the second common electrode lines.

The method for manufacturing the array substrate further includes a step of forming multiple gate lines. Optionally, the first common electrode lines and the gate lines are formed through one patterning process, and the first common electrode lines are in parallel with the gate lines.

The method for manufacturing the array substrate further includes a step of forming multiple data lines. Optionally, the second common electrode lines and the data lines are formed through one patterning process, and the second common electrode lines are in parallel with the data lines.

Unless otherwise defined, technical terms or scientific terms used in the present disclosure shall be understood as common meanings by those ordinary skilled in the art to which the present disclosure relates. Terms such as "first" and "second" in the present disclosure are merely to distinguish different components rather than to indicate any sequence, quantity or importance. Similarly, terms such as "a" or "an" merely intends to indicate there exists at least one rather than to limit the quantity. Terms such as "connected to" or "coupled to" are not limited to physical or mechanical connections and may further include either direct electrical connections or indirect electrical connections. Terms such as "above", "below", "left" and "right" merely indicate relative position relationships, and in a case that an absolute position of a described object changes, the relative position relationships with respect to the described object change accordingly.

Optional embodiments of the present disclosure are described hereinabove. It should be noted that the ordinary skilled in the art can make various improvements and polishment without departing from the principle of the disclosure, and those improvements and polishment all fall within the protection scope of the present disclosure.

What is claimed is:

1. An array substrate, comprising:
   transparent common electrodes;
   a plurality of first common electrode lines;

a plurality of second common electrode lines; and a base substrate, a gate insulating layer, a pixel electrode and an insulating layer, wherein the plurality of first common electrode lines intersects with the plurality of second common electrode lines to define grids, the plurality of first common electrode lines is connected with the common electrodes through first via-holes and the plurality of second common electrode lines is connected with the common electrodes through second via-holes, the plurality of first common electrode lines are on the base substrate;

the gate insulating layer is on the base substrate and covers the plurality of first common electrode lines;

the pixel electrode and the plurality of second common electrode lines are on the gate insulating layer;

the insulating layer is on the gate insulating layer and covers the pixel electrode and the plurality of second common electrode lines;

the transparent common electrodes are on the insulating layer;

the plurality of first via-holes extend through the insulating layer and the gate insulating layer; and the plurality of second via-holes extend through the insulating layer.

2. The array substrate according to claim 1, wherein the plurality of first common electrode lines are in a different layer from the plurality of second common electrode lines.

3. The array substrate according to claim 2, further comprising a plurality of gate lines, wherein the plurality of first common electrode lines are in an identical layer to and in parallel with the plurality of gate lines.

4. The array substrate according to claim 3, further comprising a plurality of data lines, wherein the plurality of second common electrode lines are in an identical layer to and in parallel with the plurality of data lines.

5. The array substrate according to claim 4, wherein the array substrate is a double-gate-line type array substrate, two of the plurality of gate lines are between every two adjacent rows of subpixels, one of the plurality of data lines is provided every two adjacent columns of subpixels, and one of the plurality of second common electrode lines is between every two columns of subpixels where no data line is provided.

6. The array substrate according to claim 2, wherein the common electrodes for respective subpixels are arranged separately, the common electrodes at an identical row are connected with each other through one of the plurality of first common electrode lines, and the common electrodes at an identical column are connected with each other through one of the plurality of second common electrode lines.

7. The array substrate according to claim 1, wherein each of the plurality of first via-holes is deeper than each of the plurality of second via-hole.

8. A display panel, comprising the array substrate according to claim 1.

9. A display device, comprising the display panel according to claim 8.

10. A method for manufacturing an array substrate, comprising:

forming grids by intersecting a plurality of first common electrode lines with a plurality of second common electrode lines;

forming transparent common electrodes, the plurality of first common electrode lines and the plurality of second common electrode lines in a way that the plurality of first common electrode lines are connected with the transparent common electrodes through first via-holes and the plurality of second common electrode lines are connected with the transparent common electrodes through second via-holes; and forming the plurality of first common electrode lines on a base substrate;

forming a gate insulating layer on the base substrate and covering the plurality of first common electrode lines;

forming a pixel electrode and the plurality of second common electrode lines on the gate insulating layer;

forming an insulating layer on the gate insulating layer and covering the pixel electrode and the plurality of second common electrode lines;

forming the transparent common electrodes on the insulating layer;

the plurality of first via-holes extending through the insulating layer and the gate insulating layer; and the plurality of second via-holes extending through the insulating layer.

11. The method for manufacturing the array substrate according to claim 10, wherein the plurality of first common electrode lines are in a different layer from the plurality of second common electrode lines.

12. The method for manufacturing the array substrate according to claim 11, wherein the forming the transparent common electrodes, the plurality of first common electrode lines and the plurality of second common electrode lines comprises:

forming the plurality of first common electrode lines and a plurality of gate lines in parallel with the plurality of first common electrode lines through one patterning process.

13. The method for manufacturing the array substrate according to claim 12, wherein the forming the transparent common electrodes, the plurality of first common electrode lines and the plurality of second common electrode lines comprises:

forming the plurality of second common electrode lines and a plurality of data lines in parallel with the plurality of second common electrode lines through one patterning process.

14. The array substrate according to claim 2, further comprising a plurality of data lines, wherein the plurality of second common electrode lines are in an identical layer to and in parallel with the plurality of data lines.

15. The method for manufacturing the array substrate according to claim 11, wherein the forming the transparent common electrodes, the plurality of first common electrode lines and the plurality of second common electrode lines comprises: forming the plurality of second common electrode lines and a plurality of data lines in parallel with the plurality of second common electrode lines through one patterning process.

* * * * *